US006714886B2

(12) United States Patent
Sung et al.

(10) Patent No.: US 6,714,886 B2
(45) Date of Patent: Mar. 30, 2004

(54) SYSTEM AND METHOD OF DC CALIBRATION OF AMPLIFIERS

(76) Inventors: Eric C. Sung, 770 Wildbriar Rd. NE. #304, Palm Bay, FL (US) 32905; Kantilal Bacrania, 1941 Brookside St. NE., Palm Bay, FL (US) 32907; Hsin-Shu Chen, 1004 Sloop Pl., #H2, Melbourne, FL (US) 32935; J. Mikko Hakkarainen, 5090 Misty Morn Rd., Palm Beach Gardens, FL (US) 33418; Bang-Sup Song, 1760 Castellana Rd., La Jolla, CA (US) 92037; Brian L. Allen, 2812 Whistler St., West Melbourne, FL (US) 32904; Mario Sanchez, 566 Atlantic Ave., NE., Palm Bay, FL (US) 32907

( * ) Notice: Subject to any disclaimer, the term of this patent is extended or adjusted under 35 U.S.C. 154(b) by 0 days.

(21) Appl. No.: 10/207,470

(22) Filed: Jul. 29, 2002

(65) Prior Publication Data

US 2003/0154045 A1 Aug. 14, 2003

Related U.S. Application Data

(63) Continuation-in-part of application No. 10/097,677, filed on Mar. 13, 2002.
(60) Provisional application No. 60/356,610, filed on Feb. 13, 2002.

(51) Int. Cl.[7] .................................................. H03M 1/12
(52) U.S. Cl. ........................ 702/107; 702/85; 341/120; 341/154; 341/155
(58) Field of Search .............................. 702/107, 85, 90; 341/120, 103, 155, 154, 156, 159, 133; 330/252, 261, 279, 124 D (56) References Cited

U.S. PATENT DOCUMENTS

| | | | | |
|---|---|---|---|---|
| 4,894,656 A | * | 1/1990 | Hwang et al. | 341/120 |
| 4,896,155 A | * | 1/1990 | Craiglow | 341/120 |
| 4,947,168 A | * | 8/1990 | Myers | 341/120 |
| 5,099,240 A | * | 3/1992 | Nakatani et al. | 341/156 |
| 6,188,346 B1 | | 2/2001 | Waho et al. | |
| 6,384,757 B1 | * | 5/2002 | Kosonen | 341/120 |

OTHER PUBLICATIONS

Shu et al., "A 13–b, 10–Msample/ADC Digitally Calibrated with Oversampling Delta–Sigma Converter," IEEE Journal of Solid–State Circuits, vol. 30, No. 4, Apr. 1995, pp. 443–452, ISSN: 0018–9200/95.

Kwak et al., "A 15–b, 5–Msample/s Low–Spurious CMOS ADC," IEEE Journal of Solid–State Circuits, vol. 32, No. 12, Dec. 1997, pp. 1866–1875, ISSN: 0018–9200/97.

Fu et al., "A Digital Background Calibration Technique for Time–Interleaved Analog–to–Digital Converters," IEEE Journal of Solid–State Circuits, vol. 33, No. 12, Dec. 1998, pp. 1904–1911, ISSN: 0018–9200/98.

(List continued on next page.)

Primary Examiner—John Barlow
Assistant Examiner—Hien Vo
(74) Attorney, Agent, or Firm—Gary R. Stanford (57) ABSTRACT

A compensation system for calibrating an amplifier having a compensation input including a sigma delta converter, a counter, a memory, adjust logic, a DAC, a pair of compensation capacitors, and a pair of current to voltage (I/V) converters. The converter converts an offset voltage to a bit stream. The counter stores a sum value indicative of the output offset. The memory stores a digital bias value. The adjust logic determines an adjust value based on the sum value and adjusts the stored digital bias value based on the adjust value. The DAC converts the digital bias value to a differential bias current. The compensation capacitors apply a compensation voltage to a compensation input of the amplifier. The I/V converters charge the compensation capacitors using the differential bias current. The adjust logic may use upper and lower thresholds and adjust the digital bias value by one LSB for each compensation cycle.

21 Claims, 7 Drawing Sheets

OTHER PUBLICATIONS

Erdoğan, et al., "A 12-b Digital-Background-Calibrated Algorithmic ADC with-90-dB THD," IEEE Journal of Solid-State Circuits, vol. 34, No. 12, Dec. 1999, pp. 1812-1820, ISSN: 0018-9200/99.

Dyer, et al., "FA 9.3: Analog Background Calibration of a 10b 40MSample/s Parallel Pipelined ADC," IEEE International Solid-State Circuits Conference. IEEE 1998, pp. 9.3-1-9.3-11.

Fu, et al., "FA 9.2: Digital Background Calibration of a 10b 40MSample/s Parallel Pipelined ADC," International Solid-State Circuits Conference, IEEE 1998, pp. 9.2-1-9.2-11.

Choe, et al., "MP 2.2: A 13b 40MSample/s CMOS Pipelined Folding ADC with Background Offset Trimming," 2000 IEEE International Solid-State Circuits Conference, 07803-5853-8/00, 10 pages.

* cited by examiner

SYSTEM AND METHOD OF DC CALIBRATION OF AMPLIFIERS

CROSS-REFERENCE TO RELATED APPLICATION(S)

The present application is based on U.S. Provisional Patent Application entitled "An Analog To Digital Converter", Ser. No. 60/356,610, filed Feb. 13, 2002, which is hereby incorporated by reference in its entirety. The present application is also a Continuation-In-Part of U.S. patent application entitled "An Analog To Digital Converter Using Subranging And Interpolation", Ser. No. 10/097,677, filed Mar. 13, 2002, which is also incorporated herein by reference in its entirety.

FIELD OF THE INVENTION

The present invention relates to amplifier calibration, and more particularly to DC compensation for amplifiers including transparent calibration during operation of a circuit using the amplifiers.

DESCRIPTION OF RELATED ART

Many electronic functions employ preamplifiers to amplify signals for various purposes. The present disclosure, for example, describes an analog to digital converter (ADC) that employs a stack of preamplifiers to amplify reference and/or interpolated voltages for purposes of comparison and digital conversion. It is noted that the present invention is not limited to ADC applications but may be applied to any application in which preamplifiers are employed and in which it is desired to maintain a requisite accuracy level. The terms "amplifier" and "preamplifier" are used interchangeable herein depending on manner of use in a circuit. The desired level of linearity, accuracy and resolution of the particular ADC described herein is relatively high and requires 14-bit resolution of the output digital values. The level of accuracy necessary for the preamplifiers depends upon their intended use within the ADC. The ADC described herein employs several preamplifier arrays in stages at the front end during initial conversion in which the results are used throughout the conversion process. For example, between the first and second stages, a selected portion of a sequential series of reference voltages from a main reference ladder are applied as first inputs to an array of preamplifiers, where the second inputs of each preamplifier is the sampled analog signal. In this manner, it is desired that the first and second preamplifier arrays maintain better than 14-bit accuracy.

Each preamplifier inherently generates a DC offset voltage that is amplified and added to the output voltage of the amplifier thereby introducing a significant amount of error. A DC compensation input is provided for each preamplifier whose inputs have a capacitor that can be charged with a bias voltage. For differential configurations, a pair of compensation inputs are provided to compensate a differential input. Several problems exist for designers attempting to achieve relatively high levels of accuracy and performance by providing the appropriate amount of DC compensation for each preamplifier. The output offset is difficult to measure while the preamplifiers are operating in accordance with the normal circuit function. It is also difficult to accurately measure output offsets given the limitations of the underlying substrate. The measurement problem is aggravated by the presence of noise and interference that may skew measurements and lead to erroneous results.

The ADC is intended to be incorporated into a monolithic unit on one substrate of an integrated circuit (IC) or chip. The overall passive component match for most silicon processes is 0.1% in accuracy. This translates into overall accuracy of approximately 10 bits. Only a slight improvement is possible by careful optimization and use of dummy components in the layout of the passives. Sometimes, statistical matching using arrays of passives can yield up to an order of magnitude improvement in the overall accuracy.

Correction and calibration techniques are known to improve the resolution, such as laser trimming or fuse blowing. Such post-processing techniques, however, must be performed on a part-by-part basis thereby unduly complicating and increasing cost of the manufacturing process. Also, such post-processing techniques operate under fixed conditions and do not correct for inaccuracies or changes due to temperature, aging and/or operating conditions. Integrated calibration techniques are also known and usually operate to measure error at the backend and apply a correction factor. Such calibration techniques are limited by quantization and usually limit correction to one-half bit of resolution of the converter itself. Also, the calibration techniques are incorporated in silicon and thus subject to the same limitations of the target circuitry.

It is desired to provide calibration for amplifiers (including those used as preamplifiers) that is not limited by the underlying substrate, that does not interfere with or overly complicate the manufacturing process, that operates transparently in the background and that corrects for any potential inaccuracies that may arise during normal operation.

SUMMARY OF THE INVENTION

A compensation system according to an embodiment of the present invention transparently calibrates at least one amplifier of an array of amplifiers during operation of a circuit employing the amplifier array. Each amplifier has a compensation input for receiving a compensation bias intended to minimize its output offset. The compensation system includes first and second redundant amplifiers coupled on either side of the amplifier array, an interpolative resistive ladder, a measurement circuit, a switching circuit, a compensation circuit, and a control circuit. The redundant amplifiers each have inputs coupled to inputs of a corresponding amplifier on a corresponding side of the amplifier array. The interpolative resistive ladder is coupled between the outputs of the redundant amplifiers and across the outputs of the amplifier array. The measurement circuit measures an output offset of a coupled amplifier. The switching circuit disconnects inputs and outputs of an amplifier of the amplifier array from the circuit and connects the inputs of the disconnected amplifier to a common mode voltage and connects the outputs of the disconnected amplifier to the measurement circuit to place the disconnected amplifier under calibration. The compensation circuit applies a compensation bias to the compensation input of an amplifier under calibration and adjusts the compensation bias in an attempt to reduce a measured output offset of the amplifier under calibration. The control circuit controls the calibration process.

The measurement circuit may include a sigma delta converter, a counter and adjust logic. The sigma delta converter converts an output offset into a bit stream indicative of the output offset. The counter receives the bit stream from the sigma delta converter and stores a sum value indicative of the output offset. The adjust logic determines an adjust value based on the sum value.

The compensation circuit may include a memory that stores a digital bias value and a converter that converts the stored digital bias value to a bias voltage and that applies the bias voltage to the compensation input of the amplifier under calibration. The adjust logic is configured to adjust the stored digital bias value for an amplifier under calibration. The adjust logic may include digital compare logic that compares the sum value with upper and lower thresholds, where the adjust logic adjusts the stored digital bias value only if a threshold is reached. The adjust logic may further be configured to adjust the digital bias value only by one least significant bit (LSB) at a time for each compensation cycle. This technique avoids large swings at the correction node if an erroneous decision is made by the calibration loop.

The converter may include a pair of compensation capacitors, a digital to analog converter (DAC) and a current to voltage converter. The compensation capacitors collectively apply a differential compensation voltage to a differential input of the amplifier under calibration. The DAC converts the digital bias value into a differential bias current. The current to voltage converter converts the differential bias current into a differential pair of voltages and charges the pair of compensation capacitors with the differential pair of voltages. Charging switches may be provided and controlled by the control logic to selectively recharge the pair of compensation capacitors using the differential bias current.

The memory may store a plurality of digital bias values, each for a corresponding one of the amplifiers of the amplifier array. The control circuit may conduct calibration for each amplifier of the amplifier array one at a time. For each amplifier, the control circuit controls the switching array to place an amplifier under calibration, controls the measurement circuit to measure an output offset of each amplifier under calibration and controls the compensation circuit to apply compensation to each amplifier under calibration. The control logic selectively addresses the appropriate digital bias value from the memory.

A method of transparently calibrating at least one amplifier of an array of amplifiers during operation of a circuit employing the amplifier array according to an embodiment of the present invention includes providing a pair of redundant amplifiers on either side of the amplifier array, providing an interpolative resistive ladder across the outputs of the amplifier array and outputs of the redundant amplifiers, removing inputs and outputs of an amplifier of the amplifier array from the circuit, shorting the inputs of the removed amplifier to a common mode voltage, measuring an output offset of the removed amplifier, adjusting a corresponding compensation bias applied at the compensation input of the removed amplifier in an attempt to reduce the measured output offset, and re-connecting the inputs and outputs of the amplifier to the circuit. The method may include sequentially calibrating each of the amplifiers of the amplifier array by repeating the removing, shorting, measuring, adjusting, and re-connecting for each amplifier.

The method may include storing a digital bias value, converting the digital bias value to the compensation bias, measuring an output offset of the removed amplifier using a sigma delta converter and applying an output bitstream of the sigma delta converter to a counter, and adjusting the digital bias value based on a value in the counter. The method may include storing a plurality of digital bias values, each corresponding to one amplifier of the amplifier array, and selecting a digital bias value corresponding to the removed amplifier being calibrated.

The method may further include comparing the value in the counter with predetermined upper and lower thresholds and adjusting the digital bias value only if either threshold is reached. The adjusting of the digital bias value may include incrementing or decrementing the digital bias value by one LSB at a time.

The method may further include providing a bias capacitor at the compensation input of each amplifier, and converting the digital bias value to a bias voltage for storage on a bias capacitor of a removed amplifier. A pair of bias capacitors may be provided at a corresponding differential pair of compensation inputs of each amplifier. If so, the method may include converting the digital bias value to a differential bias current and charging the pair of bias capacitors using the differential bias current.

A compensation system for calibrating an amplifier having a compensation input according to an embodiment of the present invention includes a sigma delta converter, a counter, a memory, adjust logic, a DAC, a pair of compensation capacitors, and a pair of current to voltage converters. The sigma delta converter converts an offset voltage to a bit stream indicative of the offset voltage. The counter creates a sum value indicative of the output offset. The memory stores a digital bias value. The adjust logic determines an adjust value based on the sum value and is configured to adjust the stored digital bias value based on the adjust value. The DAC converts the digital bias value to a differential bias current. The current to voltage converters turn the differential bias current into a differential output voltage which charges the compensation capacitors. The adjust logic may include digital compare logic that compares the sum value with upper and lower thresholds and that adjusts the stored digital bias value only if a threshold is reached or exceeded. The adjust logic may further be configured to adjust the digital bias value only by one LSB for each compensation cycle.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF EMBODIMENT(S) OF THE INVENTION

Figure 1:
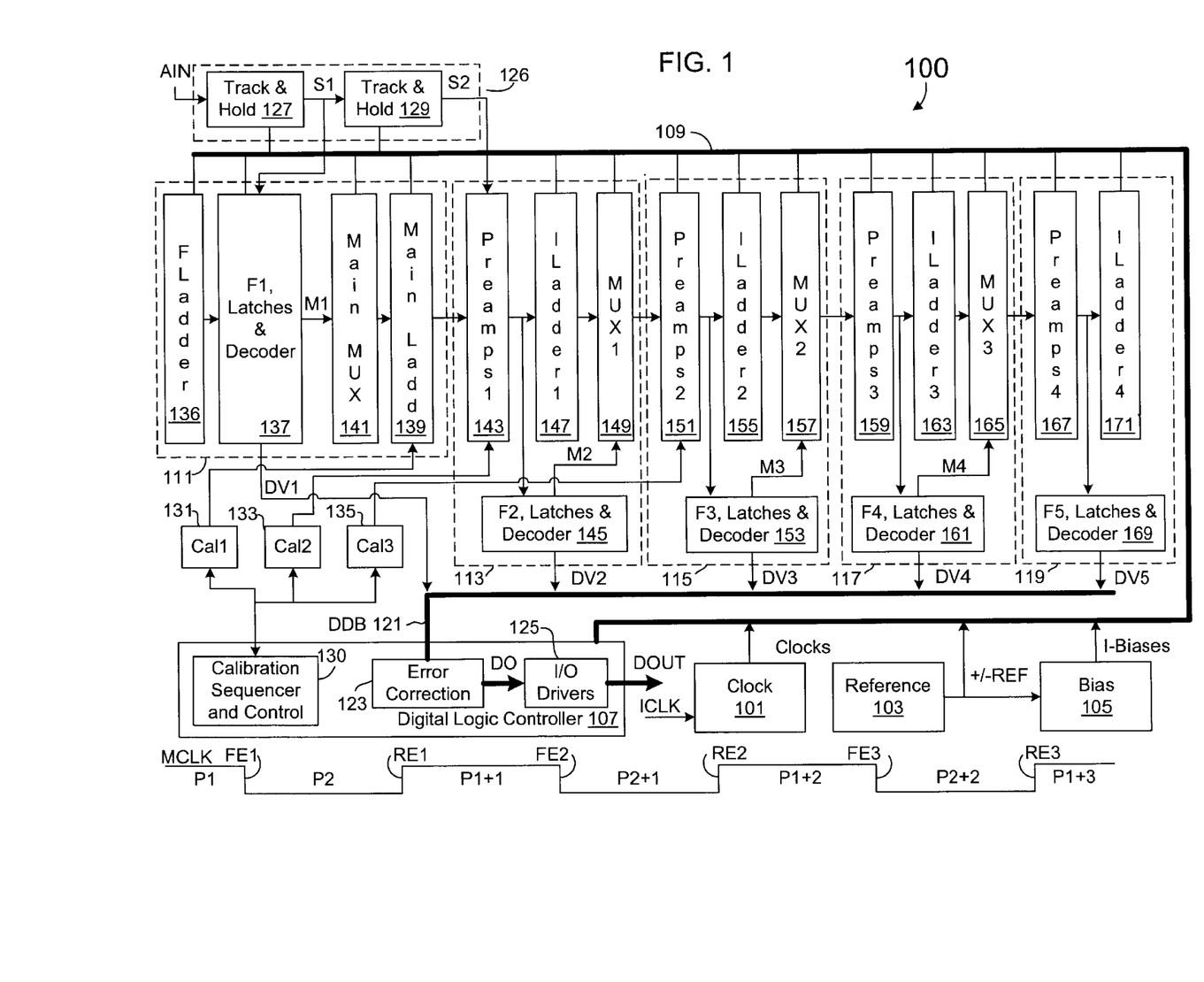
FIG. 1 is a block diagram of an exemplary analog to digital converter that is used to illustrate embodiments of the present invention.

FIG. 1 is a block diagram of an exemplary 14-bit analog to digital converter (ADC) 100 that is used to illustrate embodiments of the present invention. The ADC 100 includes support circuitry, such as a clock circuit 101, a reference circuit 103, a bias circuit 105 and a digital logic controller 107, all coupled together via a bias/clock bus 109. The clock circuit 101 receives an input clock signal ICLK and generates a plurality of clock signals "Clocks" for providing synchronization of the various components of the ADC 100. The reference circuit 103 generates reference voltage signals +REF and −REF that are sufficiently independent of temperature and power supply variations. The +/−REF signals are provided to the bias circuit 105, which develops a plurality of temperature-independent bias current signals "I-Biases" that provide current biasing for various components of the ADC 100 including preamplifiers within pipelined stages, as further described below.

The signals of the bias/clock bus 109 are distributed to other components of the ADC 100 for purposes of control, synchronization, biasing and support. The bias/clock bus 109 is not necessarily organized as a single bus but instead includes analog and digital control signals collectively shown for purposes of simplifying description without departing from the spirit and scope of the present invention. Also, many of the signals and components described herein are differential in form throughout the pipelined architecture of the ADC 100, although the principles of the present invention may be applied in a similar manner to single-ended signals and components.

In the exemplary embodiment shown, the ADC 100 is configured as a pipelined architecture with multiple stages including a first input stage 111 and one or more secondary stages 113, 115 and 117 and an output stage 119 that collectively convert a sampled analog signal, referred to as "AIN", into an output digital value. The stages are loosely defined based on a series of sequentially-coupled flash converters 137, 145, 153, 161 and 169, where each flash converter includes latches and decoders as further described below. Each of the stages 111–119 develops a corresponding 4-bit digital value DV1, DV2, DV3, DV4 and DV5, respectively, which are collectively provided to an error correction circuit 123 within the digital logic controller 107 via a 20-bit digital data bus (DDB) 121. The error correction circuit 123 converts the resulting 20-bit digital value on the DDB 121 into a 14-bit value referred to as "DO" to an input of a series of Input/Output (I/O) drivers 125. The I/O drivers 125 assert corresponding digital output signals, shown as "DOUT" signals, which are digital representations of the input analog signal AIN. The number of stages employed and the number of resolved bits per stage reflect the relative accuracy desired for the digital output. A different number of stages and/or number of resolved bits per stage may be used for different configurations or applications.

The ADC 100 includes a sample circuit 126 that regularly samples the AIN signal and that provides corresponding sample signals to the input stage 111. More particularly, the AIN signal is regularly sampled by a first track and hold circuit 127 for developing a first sample signal S1, which is provided to an input of a second track and hold circuit 129 and to an input of the first stage 111. The second track and hold circuit 129 samples the S1 signal at the same rate and asserts another sample signal S2 to an input of the second stage 113. In the exemplary embodiment illustrated, the clock circuit 101 asserts a master clock signal (MCLK) of approximately 80 MHz on the bias/clock bus 109. The MCLK signal is shown in FIG. 1 for purposes of illustration. The track and hold circuit 127 samples the AIN signal at the MCLK rate and holds its output signal S1 at the sampled level for sampling by the track and hold circuit 129. The track and hold circuit 129 also samples the S1 signal at the MCLK rate and holds its output for use by the second stage 113. In the embodiment shown, the track and hold circuits 127, 129 operate in a make before break configuration so that the voltage level of the S1 signal is transferred to the S2 signal. Although a single master clock signal is shown (MCLK), separate sample and hold clocks may be used to enable make before break operation. In any event, the track and hold circuit 129 operates like a memory to hold one sample of the AIN signal for additional time while another sample is being taken.

Each of the stages 111–119 includes a flash converter and at least one resistive ladder, where each flash converter includes latching comparators and a decoder. Each of the stages 111–117 includes select logic or a multiplexor (MUX) controlled by a corresponding flash converter for purposes of subranging the resistive ladders. Each of the stages 113–119 includes a set of preamplifiers for amplifying selected subranges. The resistive ladders each operate as an interpolator to divide a voltage range applied at the inputs or across the resistive ladder into intermediate voltages. The applied voltage range is either a reference signal (as in the first stage 111) or a residual signal from a prior stage.

The first stage 111 includes the first flash converter 137, a "flash" resistive ladder 136 (FLadder), a primary reference resistive ladder referred to as the "Main Ladder" 139 and a "Main" MUX 141 for selecting a subrange of the Main Ladder 139. The second stage 113 includes an array of preamplifiers 143 (Preamps1), the second (F2) 4-bit flash converter 145, a first interpolator resistive ladder (ILadder1) 147, and a MUX 149 (MUX1). The third stage 115 includes an array of preamplifiers 151 (Preamps2), the third (F3) 4-bit flash converter 153, a second interpolator resistive ladder (ILadder2) 155 and another MUX 157 (MUX2). The fourth stage 117 includes an array of preamplifiers 159 (Preamps3), the fourth 4-bit flash converter 161, a third interpolator resistive ladder 163 (ILadder3) and another MUX 165 (MUX3). The fifth and final stage 119 includes an array of preamplifiers 167 (Preamps4), the fifth (F5) 4-bit flash converter 169 and a fourth interpolator resistive ladder 171 (ILadder4). Although the ladders 147, 155, 163 and 171 are referred to as "interpolator" ladders referencing the interpolator function, each performs an additional function of averaging the voltage outputs of the preamplifiers 143, 151, 159 and 167, respectively, and thereby reducing any amplifier offsets. Also, the final ILadder4 171 is not needed to perform the interpolator function since it is at the end of the pipeline.

Selected components of the ADC 100 must be at least as accurate as the intended resolution of the ADC 100. In the particular embodiment shown, for example, the ADC 100 is a 14-bit converter, so that the track and hold circuits 127, 129 each have at least 14-bit accuracy. The Main Ladder 139 receives the +/−REF signal and develops a stack of intermediate reference voltage levels and is accurate to at least 14 bits in the embodiment shown. A calibration circuit 131 is provided for periodically calibrating the Main Ladder 139 to achieve and maintain the requisite accuracy. Calibration circuits 133 and 135 are provided for periodically calibrating the preamplifiers 143 and 151 to achieve and maintain the requisite level of accuracy. It is desired that remaining components have a relative or requisite degree of accuracy depending upon their functionality, design criterion and overall impact on the digital output value DOUT. The flash ladder 136, for example, has a relatively loose linearity requirement due to digital error correction and resolves only 4 bits at a time. The resistors of the flash ladder 136 and the flash converter 137 are designed to meet a speed specification (~80 MS/s) rather than accuracy. The flash converter 137 also only needs sufficient accuracy to resolve the 4 most significant bits and to select the appropriate subrange of the Main Ladder 139. Also, each of the flash converters 145, 153, 161 and 169 need only resolve 4 bits at a time. The digital logic controller 107 includes a calibration sequencer and control circuit 130 for controlling operation of the calibration circuits 131, 133 and 135. It is understood that each stage may be narrowed or widened to resolve less or more bits, respectively, for different applications.

In the exemplary embodiment shown, each of the five flash converters 137, 145, 153, 161 and 169 contribute a respective 4-bit digital or binary value, shown as DV1, DV2, DV3, DV4 and DV5, respectively, ranging from most significant to least significant, to the 20-bit DDB 121. In particular, the DDB 121 includes bit signals DDB(20 . . . 1) with DDB(20) being the most significant bit (MSB). The flash converter 137 provides DV1 as the MSB's DDB[20 . . . 17], the flash converter 145 contributes DV2 as the next bits DDB[16 . . . 13], the flash converter 153 contributes DV3 as the next bits DDB[12 . . . 9], the flash converter 161 contributes DV4 as the next bits DDB[8 . . . 5], and the flash converter 169 contributes DV5 as the least significant bits (LSB) DDB[4 . . . 1] of the DDB 121. The error correction circuit 123 regularly combines the 20 bits of the DDB 121 to generate the 14-bit DO value as further described below. The flash converters 137, 145, 153 and 161 each asserts a corresponding MUX select value M1, M2, M3 and M4, respectively, to the Main Mux 141, the MUX1 149, the MUX2 157 and the MUX3 165, respectively, for subranging the Main Ladder 139, the ILadder1 147, the ILadder2 155 and the ILadder3 163, respectively. The digital select values M1–M4 are related to the digital values DV1–DV4 according to a selected one of a number of possible coding schemes known to those skilled in the art. The format of the digital select values M1–M4 is chosen for the particular configuration and operation of the respective muxes, as further described below.

The flash ladder 136 comprises a fully differential resistor ladder using the +/−REF signals at either end to develop a sequential and differential stack of reference voltages. Each flash converter 137, 145, 153, 161 and 169 comprises a stack of comparators, each comparator consisting of a preamplifier and regenerative latch. During a first MCLK time period P1, the track and hold circuit 127 tracks the AIN signal. At a first falling edge (FE1) of the MCLK signal, the track and hold circuit 127 holds the S1 sampled signal to the flash converter 137. During the following MCLK period P2 between FE1 and the next rising edge of the MCLK signal (RE1), the flash converter 137 compares the S1 signal with each of the stack of reference voltages of the flash ladder 136. At the end of the MCLK period P2 at RE1, the flash converter 137 latches the flash preamplifier outputs and decodes the first 4-bit digital value DV1 representing the relative level of the S1 signal between the +/−REF signals. Since the S1 signal is expected to be within the +/−REF signal range and each flash preamplifier compares a corresponding interpolated reference signal with S1, the F1 flash converter 137 effectively decodes a transition point of the S1 signal in the range of the flash ladder 136.

The M1 value is provided to the Main MUX 141. At the next rising edge of the MCLK signal (RE1), beginning the MCLK period P1+1, the Main MUX 141 selects a subrange portion of the Main Ladder 139. The selected portion of the Main Ladder 139 includes sufficient overlap, as further described below, to ensure that the sampled signal is contained within the selected range and to provide digital redundancy for digital error correction. The Main Ladder 139 also receives the +/−REF signals at either end and comprises a series of primary resistors forming a resistor string, where each primary resistor is further divided by a subladder of resistors. In this manner, the +/−REF signals are finely divided into a sequential series of intermediate reference voltages by the Main Ladder 139. The Main MUX 141 comprises a switch matrix coupled to each of the subladder elements of the Main Ladder 139, and applies the selected portion or residual signal across first inputs of the Preamps1 143 during the P1+1 period. Meanwhile, the track and hold circuit 129 tracks the S1 signal during the MCLK period P2 and holds the S2 signal at the level of the S1 signal until FE2. The S2 signal, being a delayed equivalent of the originally sampled AIN signal, is applied to second inputs of the Preamps1 143. The Preamps1 143 comprise a stack of amplifiers having a predetermined gain for amplifying the difference between the S2 signal and a corresponding voltage level within the selected subrange of reference voltages from the Main Ladder 139.

During the MCLK period P1+1, the amplified residual signal from the Preamps1 143 is applied across the ILadder1 147 and to the inputs of the F2 flash converter 145. The ILadder1 147 interpolates the amplified residual signal, and the F2 flash converter 145 makes a digital decision based on the amplified residual signal to determine the second digital value DV2. The decode of the F2 flash converter 145 is similar to the decode performed by the F1 flash converter 137, and is based on a zero crossing point within the range of the ILadder1 147. At the next falling edge of the MCLK signal (FE2) beginning an MCLK period P2+1 between FE2 and the next rising edge (RE2), the F2 flash converter 145 latches the DV2 value, which is asserted on the DDB 121. The F2 flash converter 145 provides the M2 signal to the MUX1 149, where the M2 signal reflects the DV2 value. The MUX1 149 comprises a bank of switches coupled to the interpolation resistors of the ILadder1 147. During the P2+1 MCLK period, the MUX1 149 selects a portion of the ILadder1 147 and provides the selected portion across the inputs of the Preamps2 151. The M2 signal and the MUX1 149 are configured in such a manner that allows selection of an error correction band of approximately half the interpolation range on either side of the selected portion of the ILadder1 147. Although operation of the Preamps2 151 is similar to operation of the Preamps1 143, the Preamps2 151 do not amplify based on reference signals but instead amplify the differential output voltages of the selected portion of the ILadder1 147.

During the P2+1 MCLK period, The ILadder2 155 interpolates the amplified residual signal from the Preamps2 151, and the F3 flash converter 153 makes a digital decision based on the residual signal to determine the third digital value DV3 and the M3 value. The decode of the F3 flash converter 153 is similar to the F2 flash converter 145 based on a zero crossing point within the range of the ILadder2 155. At RE2 beginning an MCLK period P1+2 between RE2 and the next falling edge (FE3), the F3 flash converter 153 latches the DV3 value on the DDB 121 and generates the M3 value, which is provided to the MUX2 157. The MUX2 157 also comprises a bank of switches which are coupled to the interpolation resistors of the ILadder2 155, and the M3 value and MUX2 157 are configured to select an error correction band of approximately half the interpolation range on either side of the selected portion of the ILadder2 155. During the P1+2 MCLK period, the MUX2 157 selects a portion of the ILadder2 155 and provides the selected portion across the inputs of the Preamps3 159. The Preamps3 159 amplify the differential outputs of the selected portion of the ILadder2 155.

Configuration and operation of the next stage 117 is similar to the stage 115, where the ILadder3 163 interpolates the amplified residual signal from the Preamps3 159, and the F4 flash converter 161 makes a digital decision based on the residual signal to determine the fourth digital value DV4 and the M4 value. At FE3 beginning an MCLK period P2+2 between FE3 and the next rising edge (RE3), the F4 flash converter 161 latches the DV4 value, provides the M4 value to the MUX3 165 and asserted on the DDB 121. The MUX3 165 selects a portion of the ILadder3 163 and provides the selected portion across the inputs of the Preamps4 167, which amplify the differential outputs of the selected portion of the ILadder3 163.

In the final stage 119, the ILadder4 171 receives the amplified residual signal from the Preamps4 167. The ILadder4 171, however, does not include interpolation switches since the end of the pipeline has been reached, although it performs the averaging function for the Preamps4 167 as previously described. The F5 flash converter 169 makes a digital decision based on the residual signal to determine the fifth digital value DV5, which is latched onto the DDB 121 at RE3. At FE2, the track and hold circuit 127 holds the next sample on the S1 signal provided to the flash converter 137. At RE2, the flash converter 137 latches and decodes the next 4-bit digital value DV1 as the first digital value of the next sample of the AIN signal. Operation proceeds in this manner so that the error correction circuit 123 receives a completely new set of digital values DV1–DV5 at the next rising edge (not shown) of MCLK after RE3. In this manner, a new set of digital values is received by the error correction circuit 123 after each subsequent rising edge of the MCLK signal. New samples are continuously propagated in a synchronous manner at the sampling rate through the stages 111–119 so that the DOUT value tracks the AIN signal. A relatively insignificant delay of 3 MCLK cycles initially occurs to fill the stages of the pipeline, so that the DOUT signal is the digital representation of the AIN signal with a latency of 3 clock cycles.

Figure 2:
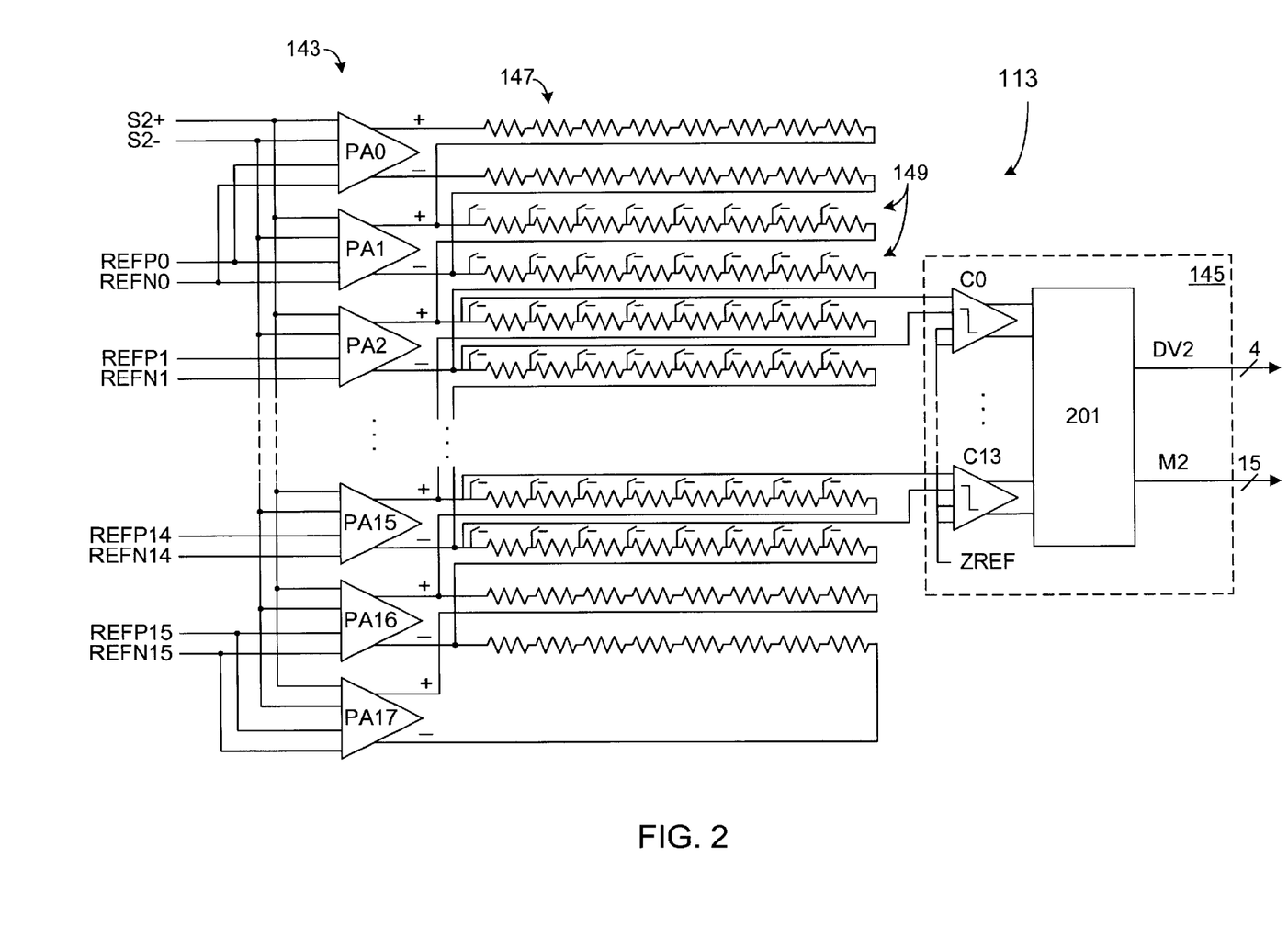
FIG. 2 is a more detailed schematic diagram of the second stage of the analog to digital converter of FIG. 1 including further details of and interconnection between the Preamps1, the F2 flash converter, the ILadder1 and the MUX1 of FIG. 1.

FIG. 2 is a more detailed schematic diagram of the stage 113 including further detail of and interconnection between the Preamps1 143, the F2 flash converter 145, the ILadder1 147 and the MUX1 149. The positive and negative polarities of the S2 signal (S2+/−) are provided to a differential input of each of the preamplifiers, shown as PA0–PA17, of the Preamps1 143. Each of the 16 differential signals from the selected portion of the Main Ladder 139 is provided to the other differential input of a respective one of the preamplifiers PA0–PA17. The Main Ladder 139 intermediate reference signals are shown as REFPx/REFNx, in which "P" denotes positive polarity, "N" denotes negative polarity and "x" is a signal index varying between 0 and 15. The REFP0/REFN0 signal is provided to the preamplifier PA1, the REFP1/REFN1 signal is provided to the preamplifier PA2, and so on. In this manner, the Preamps1 143 amplify the differential between the S2 signal and each of the selected intermediate reference signals of the selected portion of the Main Ladder 139. The Preamps1 143 include two additional or "redundant" preamplifiers PA0 and PA17 located on opposite ends of the array of preamplifiers PA1–PA16 for purposes of calibration as further described below. The additional preamplifier PA0 is coupled to the inputs of the preamplifier PA1 (S2 and REFP0/REFN0) and the additional preamplifier PA17 is coupled to the inputs of the preamplifier PA16 (S2 and REFP15/REFN15).

The ILadder1 147 includes a first polarity resistor ladder and a reverse polarity resistor ladder, where each includes 136 resistors coupled in a series configuration and where all the resistors have approximately the same resistance. The positive polarity ladder includes 17 groups of 8 resistors each, where each group of 8 resistors is coupled between the positive output terminals of a respective adjacent pair of the preamplifiers PA0–PA17. Likewise, the reverse polarity ladder includes 17 groups of 8 resistors each, where each group of 8 resistors is coupled between the negative output terminals of a respective adjacent pair of the preamplifiers PA0–PA17. In this manner, the differential outputs of the preamplifiers PA0–PA17 are interpolated into intermediate voltage levels by the ILadder1 147.

The differential outputs of the middle 14 preamplifiers PA2–PA15 are provided to corresponding differential inputs of comparators C0–C13, respectively, of the F2 flash converter 145. An exception to this occurs when a preamplifier is removed for calibration in which the corresponding resistor taps of the ILadder1147 supply the interpolated voltages as further described below. The comparators C0–C13 of the F2 flash converter 145 are configured in substantially the same manner as the comparators of the F1 flash 137, where each comparator includes a preamplifier and latch combination. For the F2 flash 145, however, one differential input of each of the comparators C0–C13 receives a zero reference signal ZREF rather than the S1 signal. Operation of the F2 flash converter 145 is substantially the same as the F1 flash converter 137 except that comparison is made with the ZREF signal rather than with the S1 signal. The F2 flash converter 145 includes a decoder 201 that resolves a zero crossing point within the amplified residual signal from the Preamps1 143 and asserts the DV2 digital value and the M2 value both indicative of the zero crossing point. The M2 signal is fed back to activate selected ones of a plurality of switches of the MUX1 149. The switches of the MUX1 149 are normally-open switches positioned at junctions between the resistors of the ILadder1 147 in a similar manner as described above for the switches of the Main MUX 141 relative to the Main Ladder 139.

Additional description and details of the ADC 100 other than calibration are not included herein and are not necessary for a full and complete disclosure and understanding of the present invention. The present disclosure focuses on calibration of the preamplifiers 143 and 151 using the calibration sequencer and control circuit 130 and the calibration circuits 133 and 135. Only calibration of one of the preamplifiers 143 is illustrated herein using the calibration circuit 133 where it is understood that the configuration and operating principles of the remaining preamplifiers 151 and of the calibration circuit 135 are substantially similar.

Figure 3:
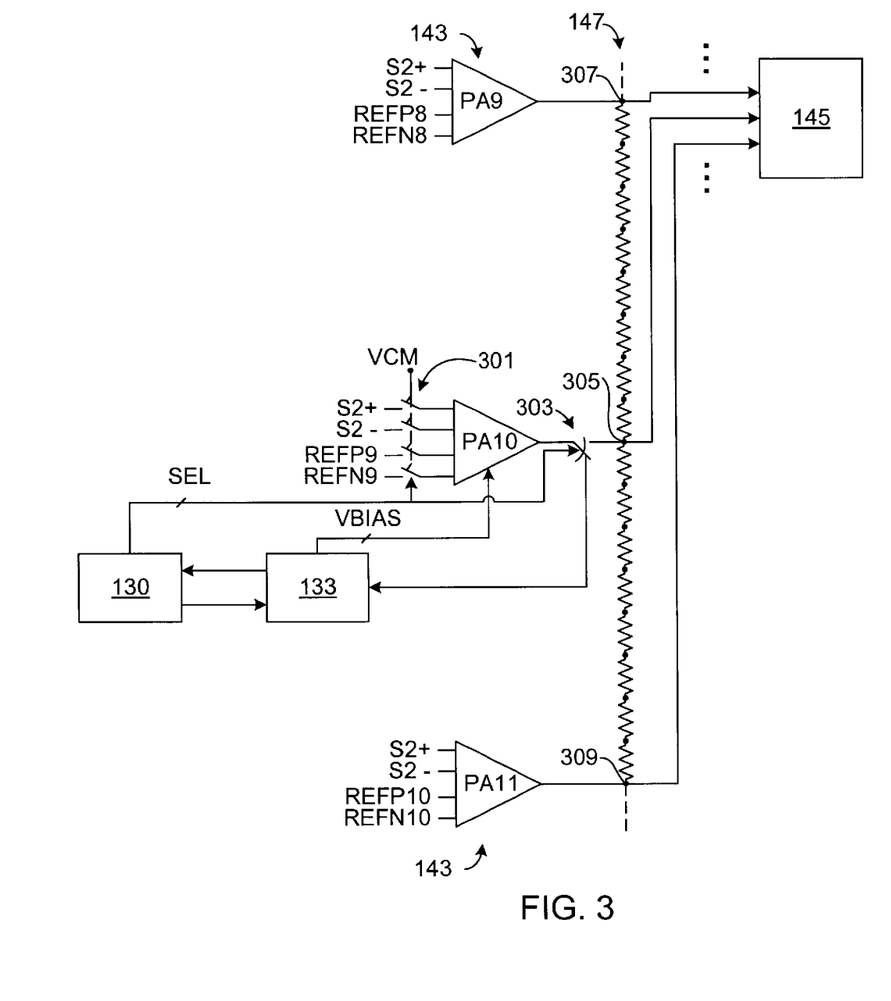
FIG. 3 is a schematic diagram showing a portion of the Preamps1 and the ILadder1 and illustrating operation of the calibration circuitry for disconnecting a preamplifier for calibration and interpolation of voltages across the ILadder1 using the preamplifiers on either side of the removed preamplifier to facilitate transparent calibration.

FIG. 3 is a schematic diagram of a portion of the Preamps1 143 and the ILadder1 147 and illustrates operation of the calibration circuits 133, 130 for temporarily removing or disconnecting a selected preamplifier, shown as preamplifier PA10, from the Preamps1 143 and for connecting the removed preamplifier to the calibration circuit 133 for calibration. The interpolation of voltages across the ILadder1 147 using the preamplifiers PA9 and PA11 located on either side of the removed preamplifier PA10 is also illustrated. The diagram is illustrated in single-ended format where it is understood that the circuitry is fully differential in the configuration shown, although the present invention is not limited to either single or differential configurations.

The calibration sequencer and control circuit 130 controls selection of each preamplifier for calibration and connection to the calibration circuit 133. As shown, the calibration sequencer and control circuit 130 asserts one or more selection signals (SEL) that control a plurality of input switches 301 and a corresponding plurality of output switches 303 to remove the selected preamplifier PA10 from the conversion circuitry and to connect the preamplifier for calibration. In particular, the input switches 301 disconnect the inputs of the preamplifier PA10 from receiving the input signals S2+, S2−, REFP9 and REFN9 and connect the inputs of the preamplifier PA10 to one or more common mode voltages (VCM) for purposes of calibration. The VCM signal(s) effectively provides a virtual ground for the inputs of each preamplifier during calibration so that the effectiveness of the bias voltages applied for offset compensation are isolated and thus may be measured via the output of the preamplifier PA10. The VCM signal may be ground. Although a single VCM signal appears to be shown, it is noted that two different common mode voltages may be used including one for the S2+/− inputs from the second track and hold circuit 129 and another for the REFP/N inputs from the Main Ladder 139.

The output switches 303 disconnect the outputs of the preamplifier PA10 from the ILadder1 147 and connect the outputs of the preamplifier PA10 to the calibration circuit 133. In this manner, the preamplifier under calibration is taken "out of the loop" of the circuitry performing the normal conversion process of the ADC 100. The calibration sequencer and control circuit 130 also controls operation of the calibration circuit 133 to conduct the calibration of the preamplifier PA10 and to adjust the bias voltages to the preamplifier PA10 to complete the calibration. As described further below, a pair of bias voltages VBIASA and VBIASB are applied to a pair of preamplifier DC compensation inputs to provide differential DC compensation. Each VBIAS voltage is provided to counteract the preamplifier DC offsets that would otherwise introduce significant error into the conversion process of the ADC 100.

During calibration, the preamplifier under calibration does not assert its output to the ILadder1 147. Nonetheless, the surrounding preamplifiers drive the ILadder1 147 and provided interpolated voltages for the temporarily disconnected preamplifier. As shown, for example, while the preamplifier PA10 is being calibrated, it is disconnected from driving node 305 of the ILadder1 147. The surrounding preamplifiers PA9 and PA11 assert voltages at nodes 307 and 309, respectively, of the ILadder1 147, which develops a corresponding intermediate voltage at node 305 through the process of interpolation. In general, the voltage at node 305 is the average of the voltages at nodes 307 and 309 asserted by the preamplifiers PA9 and PA11. In this manner, removing a preamplifier does little or no harm to the overall operation of the ADC 100 so that the calibration operation is effectively "transparent." Similar switches (not shown) controlled by the calibration sequencer and control circuit 130 are provided for each of the preamplifiers PA1–PA16. The redundant preamplifiers PA0 and PA17 are not calibrated but instead are provided to achieve the interpolation process during calibration of the preamplifiers PA1 and PA16, respectively.

For example, during calibration of the preamplifier PA1, the surrounding preamplifiers PA0 and PA2 drive the ILadder1 147, which interpolates the output voltages of the surrounding preamplifiers PA0 and PA2 to maintain the conversion operation of the ADC 100 in spite of the missing preamplifier PA1. Similarly, during calibration of the preamplifier PA16, the surrounding preamplifiers PA15 and PA17 drive the ILadder1 147, which interpolates the output voltages of the surrounding preamplifiers PA15 and PA17 to maintain the conversion operation of the ADC 100 in spite of the missing preamplifier PA16. In this manner, each of the primary (intermediate) preamplifiers of the array of preamplifiers may be transparently calibrated in the background without effecting circuit operation.

The calibration sequencer and control circuit 130 sequences through each of the preamplifiers PA1–PA16 one by one. The whole process is repeated continuously in the background looping through the preamplifiers PA1–PA16 one at a time to continuously correct the corresponding preamplifier offsets in order to converge to the appropriate level of DC compensation. Substantially the same process is conducted for the Preamps2 151 using the conversion circuit 135 as controlled by the calibration sequencer and control circuit 130, except that calibration switching for the Preamps1 143 and Preamps2 151 are conducted during opposite phases of the calibration clock cycle.

Figure 4:
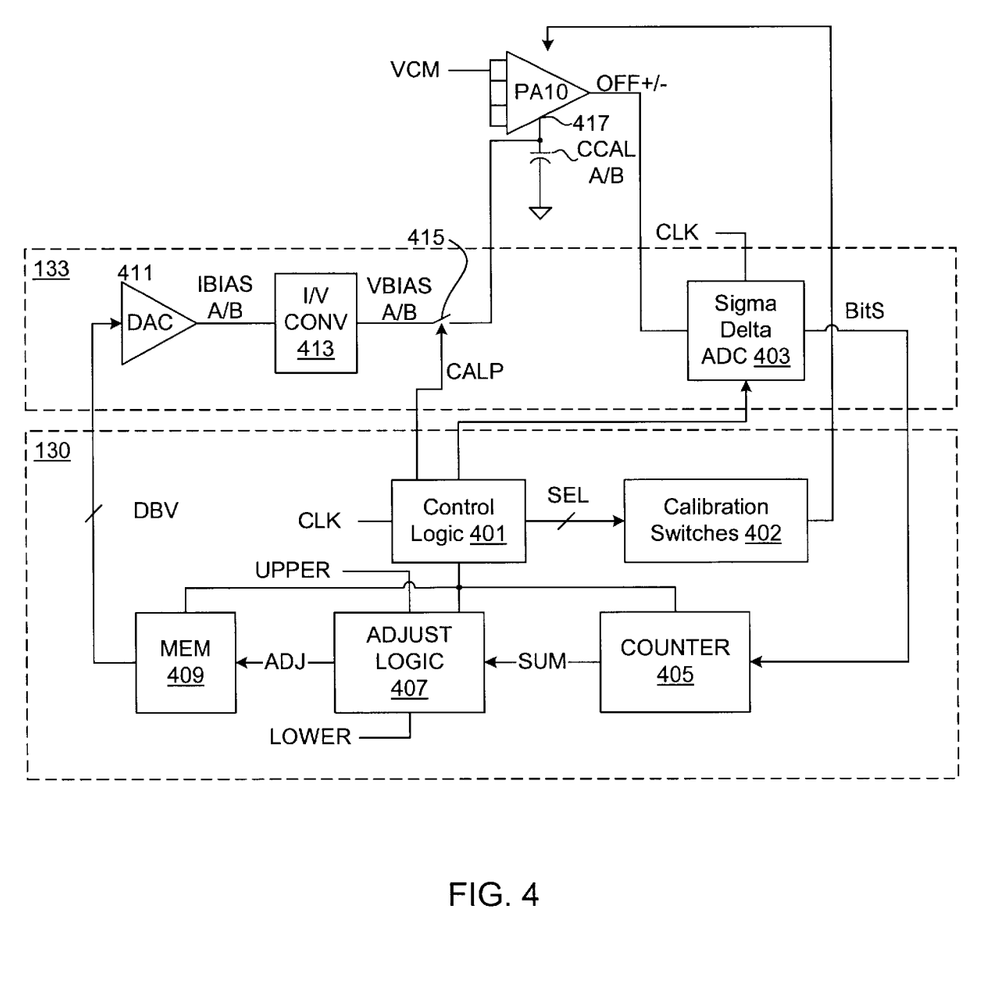
FIG. 4 is a block diagram illustrating configuration of an exemplary embodiment of the calibration circuit and applicable portions of the calibration sequencer and control circuit of FIG. 1 for calibrating the disconnected preamplifier of FIG. 3.

FIG. 4 is a block diagram illustrating configuration of an exemplary embodiment of the calibration circuit 133 and a portion of the calibration sequencer and control circuit 130 for calibrating each preamplifier of the Preamps1 143 as illustrated by the preamplifier PA10. The calibration sequencer and control circuit 130 includes control logic 401 receiving a clock signal CLK for controlling calibration operations. The CLK signal is a sample edge clock used for calibration that has a reduced rate relative to the system clock (e.g., MCLK), such as by a factor of 8. The control logic 401 asserts the SEL signals to calibration switches 402 for removing each preamplifier from the circuit one at a time and connecting to the calibration circuit 133. The switches 301, 303, for example, are included within the calibration switches 402 for removing the preamplifier PA10. As shown, the preamplifier PA10 has its inputs coupled to one or more common mode voltages (VCM) and its outputs coupled to the calibration circuit 133.

Each of the preamplifiers includes one or more calibration capacitors that store corresponding bias voltages to provide DC compensation that reduces or otherwise eliminates output offsets. The preamplifier PA10 is shown with two calibration capacitors CCALA and CCALB (shown as CCAL A/B), that are coupled between a differential compensation input 417 of the preamplifier PA10 and ground. The calibration capacitors CCAL A/B collectively store a differential bias voltage VBIASA, VBIASB (shown as VBIAS A/B). The pair of bias voltages VBIASA, VBIASB effectively provide a differential bias voltage for a differential input of the preamplifier PA10. When the preamplifier PA10 is removed for calibration and coupled to the VCM inputs as shown, it is desired that the bias voltages VBIAS A/B reduce the differential output voltage OFF (shown as OFF+/−) to zero or as close to zero as possible within an allowable tolerance.

The differential OFF output signal is provided to the input of a sigma-delta (Σ-Δ) analog to digital converter (ADC) 403, which outputs a stream of bits (BitS) representing the voltage of the OFF signal. The control logic 401 is coupled to control the measurement cycle of the sigma-delta ADC 403, which is synchronized via the CLK signal. The BitS signal is provided to a counter 405 within the calibration sequencer and control circuit 130, which adds the number of 1's (or, alternatively, 0's) of BitS for a predetermined interval to generate a SUM value. In this manner, the SUM value represents an error of the VBIASA, VBIASB bias voltages. The SUM value is provided to adjust logic 407, which correspondingly adjusts a digital bias value (DBV) stored in a memory 409. The DBV value from the memory 409 is provided to the input of a differential digital to analog converter (DAC) 411, which generates differential bias currents IBIASA, IBIASB (shown as IBIAS A/B) at its output. The IBIAS A/B differential signal is provided to a current-to-voltage (I/V) converter 413, which asserts the VBIAS A/B voltage at its output. In one embodiment, the I/V converter 413 comprises a pair of converters for separately converting the A/B polarities. The VBIAS A/B voltage is provided to respective terminals of a pair of switches 415 (shown as a single switch), having their other terminals coupled to the corresponding compensation inputs 417 of the preamplifier PA10 and thus also to the CCAL A/B capacitors. The switches 415 are controlled by a calibration signal CALP generated by the control logic 401. In general, the control logic 401 closes the switches 415 to charge the CCAL A/B capacitors with the VBIAS A/B voltages, respectively, to update or otherwise refresh the capacitors. The CCAL A/B capacitors provide a differential bias voltage at a differential input of the preamplifier PA10 to provide DC compensation in an attempt to reduce the magnitude of the OFF signal to as close to zero as possible.

The DAC 411 has a current steering architecture. The conversion from DAC output currents to voltages works in a pseudo-differential manner as further described below in the description of an exemplary I/V converter 413. The DAC 411 should have a sufficient dynamic range to be able to handle potentially large offsets (high full scale level) but correct to within a predetermined voltage level. These considerations determine the number of bits of the digital value in the memory 409 and the bit-size of the DAC 411. Eight bits are sufficient for a particular configuration, but may be changed as necessary. For the differential embodiment, the memory stores a pair of digital bias values and the calibration circuit 133 includes a DAC 411 and I/V converters 413 to generate a differential pair of bias voltages VBIAS A/B.

The control logic 401 controls the selection of each preamplifier and the duration of each measurement cycle by the sigma-delta ADC 403, such as by selection of a number of clock cycles of the CLK signal. The control logic 401 initializes (e.g., clears, resets, etc.) the counter 405 before each measurement cycle, and after each measurement cycle, prompts the adjust logic 407 to use the SUM value from the counter 405 to make a corresponding adjustment to the digital value stored in the memory 409 via the ADJ signal. The adjust logic 407 includes digital compare logic or the like, which compares the SUM value with a predetermined upper threshold (UPPER) value and a predetermined lower threshold (LOWER) value in the embodiment shown. The UPPER and LOWER values may be arbitrarily determined to buffer a certain level of noise and/or error of measurement to avoid continuous insignificant adjustments. Also, the UPPER and LOWER values are programmable to correspond to a selected measurement cycle duration. For example, for a measurement cycle of 512 with a target SUM value of 256 (representing OFF=0), the UPPER and LOWER values may be set to any value above and below, respectively, the target SUM value within a selected range (e.g., UPPER within 257–261 and LOWER within 251–255 for range of 5 LSB). The closer the thresholds are to the target SUM value, the more often adjustments are made.

Both UPPER and LOWER thresholds could both be set to the target SUM value (or offset by one, e.g., 257, 255) to effectively reduce or otherwise eliminate the threshold function. The thresholds may be skewed, if desired, to provide a larger upper threshold relative to the lower threshold or vice-versa.

The adjust logic 407 asserts the ADJ value to adjust a corresponding DBV stored in the memory 409. If neither threshold is reached, then the adjust logic 407 sets the ADJ value to zero so that no adjustment is made since the VBIAS A/B voltage is within tolerance to achieve a desired level of accuracy. If either threshold is reached or exceeded, then the ADJ value is set to a corresponding value to correct for the measured error and added to the digital value. The ADJ value may be positive or negative depending upon whether the corresponding VBIAS A/B signal is to be increased or decreased. The magnitude of ADJ value is according to any one of several feedback correction options. In one embodiment, the ADJ value is +1, 0 or −1 where the digital bias value in the memory 409 is adjusted only 1-bit (1 least significant bit (LSB)) at a time. If the OFF voltage is positive (negative) causing the SUM value to equal or exceed magnitude of the UPPER (LOWER) threshold, then the AJD value is −1 (+1), which decrements (increments) DBV value by one. Although this first described embodiment appears to provide the slowest adjustment, it provides very stable operation in which calibration converges relatively quickly since measurements are made in a continuous and ongoing manner.

In one embodiment, the memory 409 is configured as an array of counters so that a separate counter is provided for each preamplifier for storing a corresponding digital bias value. The control logic 401 selects or otherwise addresses the correct counter to output the digital bias value corresponding to the preamplifier under calibration.

It is appreciated that the combination of the sigma delta ADC 403 and the adjust logic 407 may be implemented to provide a significant amount of accuracy and noise immunity. Sigma delta techniques inherently achieve a high degree of accuracy over time. The measurement cycle of the sigma delta ADC 403 is programmable and may be made sufficiently long to achieve a high level of accuracy. Longer cycles result in slower convergence yet a greater immunity to noise. The adjust logic 407 may be configured to increment or decrement the applicable counter by one least significant bit per measurement cycle. In this manner, the compensation adjust converges more slowly yet provides a significant level of noise and interference immunity. In particular, although a large spurious noise spike may skew one measurement cycle causing an erroneous adjustment, such error is relatively inconsequential since the DBV counters are adjusted only by one LSB at a time thereby minimizing any effects of spurious noise.

In an alternative embodiment, the magnitude of the ADJ value is proportional to the difference between the SUM and target values, such as a selected percentage of the difference. For example, if the SUM value is 270 for a target value of 256 providing a difference of 24, a half-scale adjustment based on 12 may be used. The half-scale value 12 is not necessarily the value used directly as the ADJ value, but is further scaled as necessary to provide an ADJ value that results in a half-scale reduction of the OFF voltage. The selected percentage is sufficiently low to avoid significant overshoot and/or possible instability of the calibration loop. Although the ADJ value could be derived to provide a full scale canceling of the output offset in every iteration, such may lead to jittery operation and/or potential instability.

Figure 5:
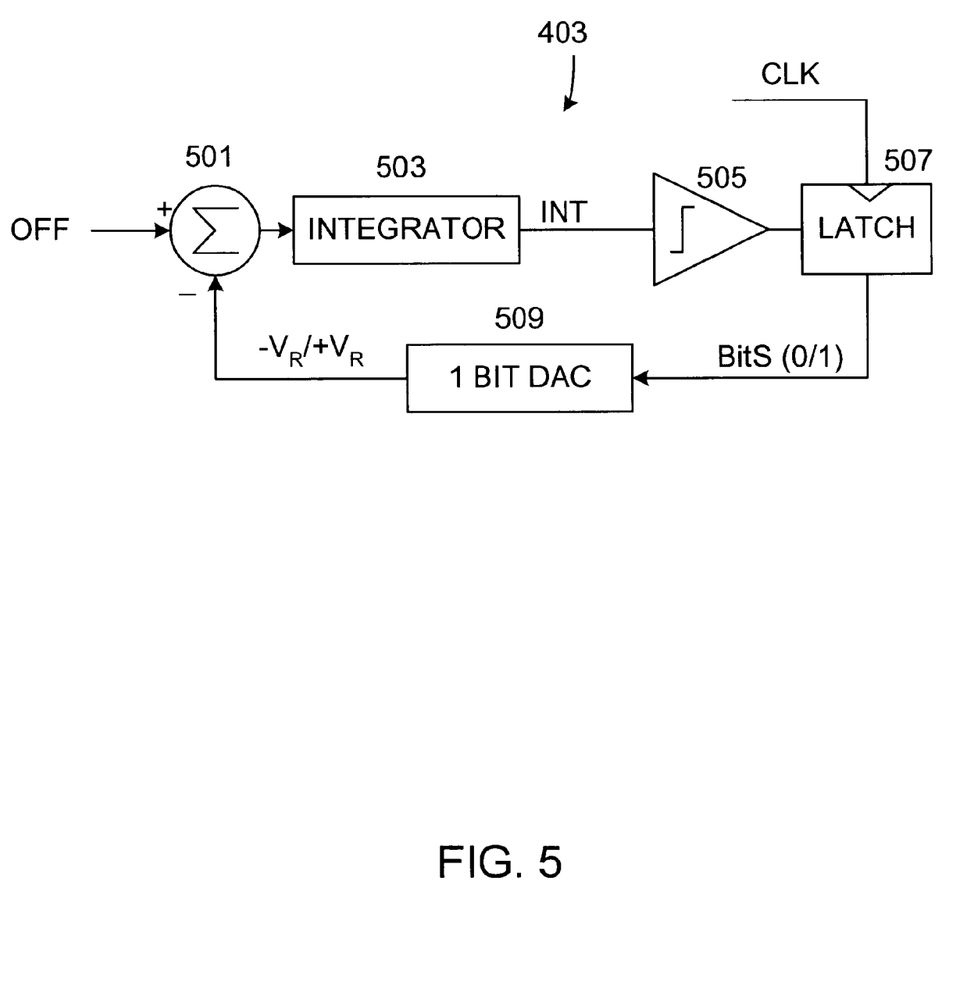
FIG. 5 is a block diagram of an exemplary embodiment of the sigma-delta analog to digital converter of FIG. 4.

FIG. 5 is a block diagram of an exemplary embodiment of the sigma-delta ADC 403. The sigma-delta ADC 403 is shown in a single-ended format where it is understood that differential operation is contemplated. The differential OFF signal is provided to a positive input of a summing junction 501. The summing junction 501 includes a negative input coupled to the output of a 1-bit DAC 509. The summing junction 501 subtracts the output of the 1-bit DAC 509 from the OFF signal and provides the output result to the input of an integrator 503. The integrator 503 integrates the difference output of the summing junction 501 and provides an INT signal indicative thereof. The INT signal is provided to the input of a comparator 505, which provides its output to the input of a latch 507. The latch 507 is clocked by clock signal CLK and asserts the bit stream BitS signal (one bit per CLK cycle) to the input of the 1-bit DAC 509. The 1-bit DAC 509 asserts a scaled reference voltage of $-V_R/+V_R$ for bit inputs of 0/1, respectively. The magnitude of $V_R$ corresponds to the scale of the voltages of the OFF signal.

In operation, the sigma-delta ADC 405 asserts bits (0's, 1's) on the BitS signal to reflect the OFF signal. The relative number of 1's and 0's determines the polarity and magnitude of the OFF signal. For example, the sigma-delta ADC 403 asserts a relatively equal number of 1's and 0's if the OFF signal is equal to or sufficiently close to zero. The sigma-delta ADC 403 asserts a greater number of 1's for positive OFF levels and a greater number of 0's for negative OFF levels. The relative number of 1's represents the magnitude of the OFF signal. The BitS signal is provided to the counter 405 which counts the number of 1's for a given measurement interval. Of course, the 0's may be counted in an alternative embodiment. The control logic 405 determines the duration of each measurement interval, which may be programmed depending upon the relative accuracy desired. Durations of 256, 512, 1024, etc., up to 16,384 clock cycles or more are contemplated for the ADC 100. The size or duration of the measurement interval is considered with the resulting SUM value to reflect the OFF signal. For example, if the interval is 1024 and OFF is zero, then the SUM value is 512 or relatively close to a target value of 512 (equal number of 1's and 0's).

In one specific configuration, the BitS output is fed to a digital decimation filter, which takes a weighted average over a fixed number of cycles. The ratio of the averaging cycle length to the modulator clock period (rate at which comparator output is latched) is called the oversampling ratio (OSR). For the ADC 100, the decimator is simply an accumulator or averager. Crudely speaking, $2^N$ BIT samples yields a resolution of about N-bits. The averaging operation filters out a significant amount of the high frequency bit-toggling noise, which is the quantization noise of the comparator 505 (1-bit analog to digital converter or ADC). Quantization noise is reduced dramatically by averaging. A 1-bit DAC is inherently linear, because it only produces 2 outputs and thus no interpolation, which would otherwise cause levels to be misplaced from a straight line. This is the fundamental reason for the high linearity potential of 1-bit oversampled ADC's.

Figure 6:
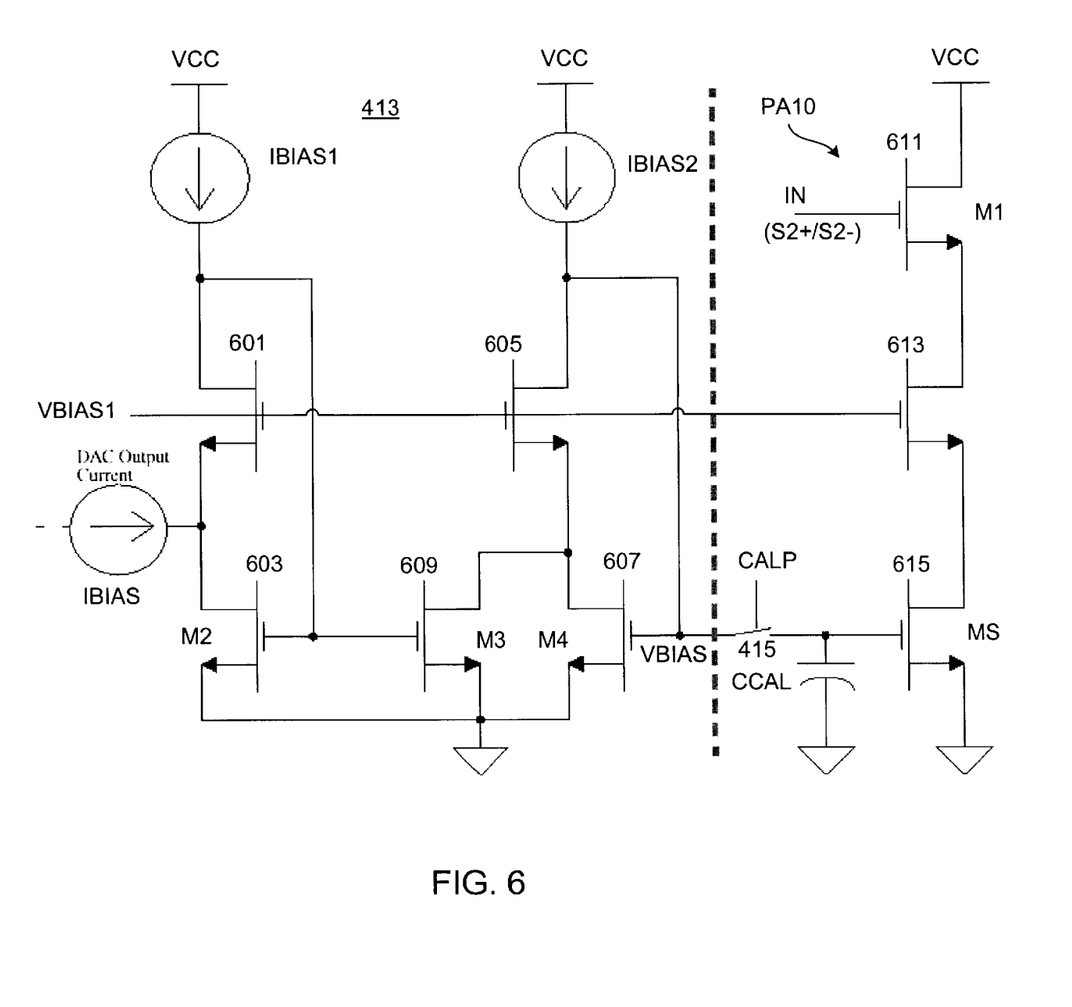
FIG. 6 is a schematic diagram of an exemplary embodiment of a current to voltage converter that may be used in the circuit of FIG. 4 as interfaced to an exemplary preamplifier input configuration.

FIG. 6 is a schematic diagram of an exemplary I/V converter 413 interfaced to one polarity input of an exemplary preamplifier input configuration. The I/V converter 413 illustrated converts a single polarity signal (e.g., VBIASA), so that a duplicate circuit is provided to convert the opposite polarity signal (e.g., VBIASB). A current source IBIAS1 has an input coupled to a voltage source, referred to as VCC, and an output coupled to the drain of an N-channel field-effect transistor (FET) 601 and to the gate of another N-channel FET 603 (M2). The gate of the FET 601 receives a common voltage bias signal referred to as VBIAS1. The source of FET 601 is coupled to the drain of FET 603 and the source of FET 603 is coupled to ground. One polarity of the DAC 411 output current, shown as IBIAS, is provided to the drain-source connection of the FETs 601 and 603. In this case, IBIAS represents either polarity of the differential IBIAS A/B signal. Another current source IBIAS2 has an input coupled to VCC and an output coupled to the drain of an N-channel FET 605 and to the gate of another N-channel FET 607 (M4). The gate of the FET 605 receives VBIAS1. The source of FET 605 is coupled to the drains of FET 607 and another N-channel FET 609 (M3). The gates of the FETs 603 and 609 are coupled together. The sources of FETs 607 and 609 are coupled to together at ground. The gate of FET 607 develops a signal VBIAS, which represents either polarity of the differential VBIAS A/B signal.

On the preamplifier side, a first N-channel FET 611 (M1) receives an input signal referred to as IN and has its drain coupled to VCC. The source of FET 611 is coupled to the drain of another N-channel FET 613, having its gate receiving VBIAS1. The source of FET 613 is coupled to the drain of another N-channel FET 615 (MS), having its source coupled to ground. The gate of FET 615 is coupled to one terminal of a capacitor CCAL and to one terminal of one of the switches 415 controlled by the control logic 401 via the calibration signal CALP. The capacitor CCAL represents either one of the pair of compensation capacitors CCAL A/B. The control logic 401 asserts the CALP signal to close the switch 415 to charge the capacitor CCAL with the VBIAS voltage during each calibration. Between each calibration cycle, the control logic 401 closes the switch 415 periodically to refresh the capacitor CCAL. The IN signal represents one polarity of a differential input signal. For example, for the preamplifiers of Preamps1 143, the differential IN signal represents the S2+ and S2−signals from the second track and hold circuit 129. In operation, IBIAS is added to IBIAS1 and the sum is scaled by the current mirror formed by FETs 603, 609. The resulting scaled current is added to IBIAS2 and the VBIAS voltage is developed at the gate of FET 607. Only one polarity is illustrated where it is understood that a substantially similar circuit is provided for the other polarity. In this manner, the two calibration capacitors CCAL A/B are charged with corresponding bias voltages VBIAS A/B and applied to respective compensation inputs of each preamplifier.

Figure 7:
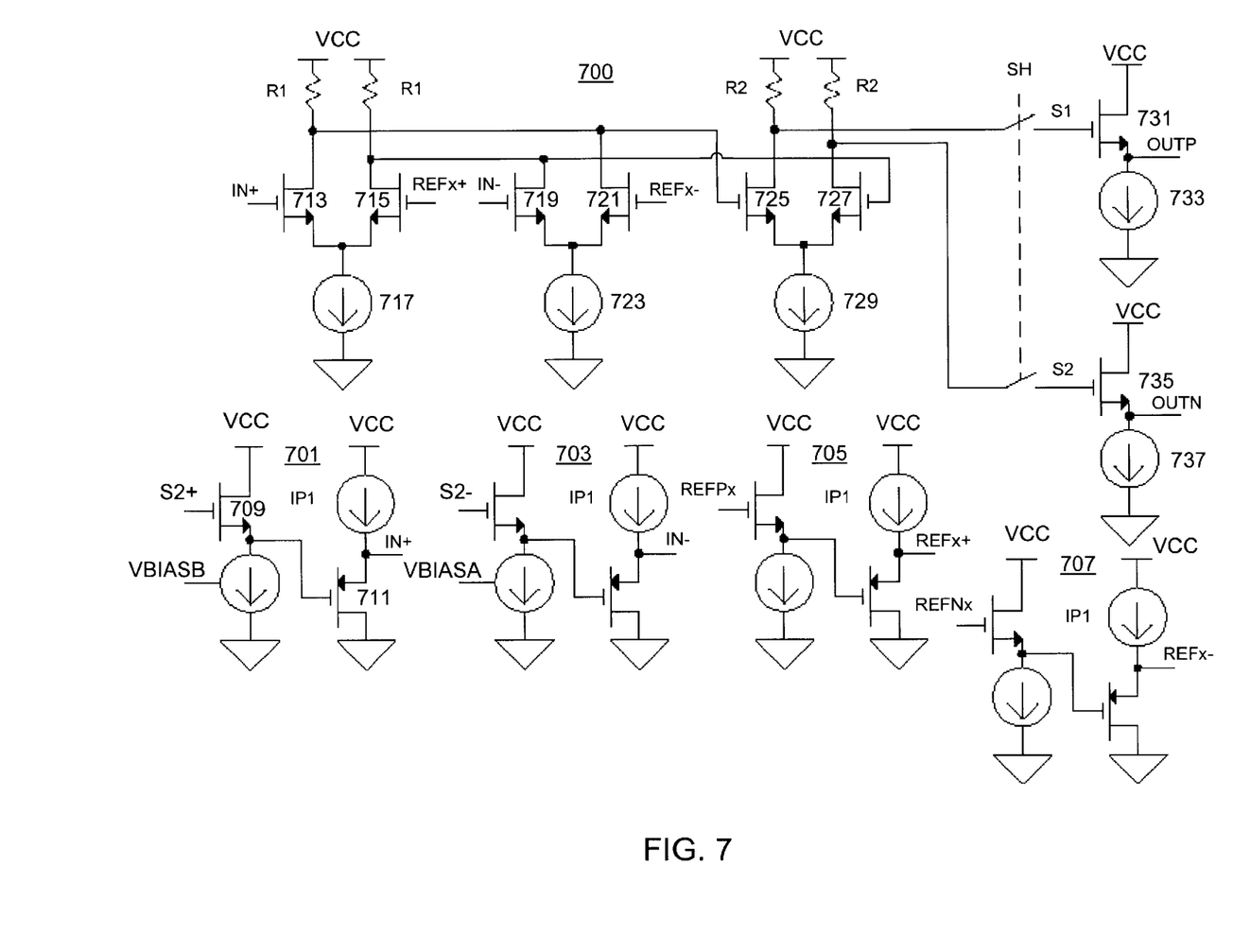
FIG. 7 is a schematic diagram of an exemplary embodiment of the preamplifier of FIG. 3.

FIG. 7 is a schematic diagram illustrating an exemplary embodiment of a preamplifier 700 representing any of the preamplifiers of the Preamps1 143 including the preamplifier PA10. The input signals S2+ and S2− from the second track and hold circuit 129 and the signals REFPx and REFNx from the Main Ladder 139 are each provided to the respective inputs of four exemplary source follower circuits 701, 703, 705 and 707, respectively. The source follower circuit 701 includes an N-channel FET 709 having its drain coupled to VCC and its source coupled to a bias current sink controlled by the compensation voltage VBIASB. VBIASB is the bias current developed by a corresponding I/V converter 413 for the particular preamplifier 700 for purposes of calibration. The gate of FET 709 receives the S2+input signal. The source of FET 709 is coupled to the gate of a P-channel FET 711, having its source referenced to a bias current source IP1 (coupled to VCC) and its drain coupled to ground. An output voltage IN+ develops at the source of FET 711. The source follower circuits 703–707 are substantially identical. For the source follower circuit 703, S2+ is replaced by S2−, VBIASB is replaced by VBIASA, and the signal IN− is developed rather than IN+. The VBIASA and VBIASB voltages collectively calibrate the preamplifier 700. For the source follower circuit 705, S2+ is replaced by REFPx, VBIASB is replaced by a bias voltage VBIAS, and the signal REFx+ is developed rather than IN+. For the source follower circuit 707, S2+ is replaced by REFNx, VBIASB is replaced by a bias voltage VBIAS, and the signal REFx− is developed rather than IN+.

The IN+ and REFx+ signals are provided to the respective gates of two N-channel FETs 713, 715 coupled as a differential pair. The drains of the FETs 713, 715 are each coupled to a pullup resistor R1 coupled to VCC and the sources are coupled together and biased by a current sink 717. The IN− and REFx−signals are provided to the respective gates of two N-channel FETs 719, 721 coupled as a differential pair. The drain of FET 719 is coupled to the drain of FET 715 and the drain of FET 721 is coupled to the drain of FET 713. The sources of the FETs 719, 721 are coupled together and biased by a bias current sink 723 to ground. The drains of FETs 713 and 721 are both coupled at the gate of an N-channel FET 725 and the drains of FETs 715 and 719 are both coupled to the gate of another N-channel FET 727. The FETs 725 and 727 are coupled as a differential pair, each having its drain coupled to a separate pullup resistor R2 to VCC. The sources of the FETs 725 and 727 are coupled together and biased by a current sink 729 to ground. The drain of the FET 725 is coupled to the gate of an output N-channel FET 731 through a switch S1. The drain of the FET 727 is coupled to the gate of another output N-channel FET 735 through another switch S2. The source of the FET 731 is biased by a current sink 733 and develops an output voltage OUTP. The source of the FET 735 is biased by a current sink 737 and develops an output voltage OUTN. The switches S1 and S2 are controlled by a clock signal SH. OUTP and OUTN form the differential output of the preamplifier 700.

The four inputs are provided because of the differential inputs and the differential reference. The source follower circuits 701–707 provide a small capacitive load to the second track and hold circuit 129 and the Main Ladder 139 to provide sufficient buffering. Calibration of the preamplifier offsets is applied to the source follower current sources via VBIASA and VBIASB. The cascade of the two differential amplifiers allows for a high gain-bandwidth product. The switches S1 and S2 and final source followers act as track-and-holds for pipelined operation of the ADC 100. When the switches S1 and S2 are opened, the stage is considered to be in the hold mode. In this mode, the preamplifier inputs are tied to a common-mode voltage (i.e. differential zero). The voltages before the switches S1 and S2 are forced to the output common-mode voltage. The voltages after the switches are held to be sampled by the second stage. The individual preamplifiers of the Preamps2 151 are similar except that only two source follower circuits are provided since there are no reference inputs. The pair of source follower circuits of each preamplifier of the Preamps2 151 are biased using the pair of bias voltages (VBIAS A/B) in a substantially identical manner.

It is appreciated that a calibration technique according to embodiments of the present invention provides a high level of linearity and accuracy that is not limited to the overall passive component match for most silicon processes. Careful optimization techniques, statistical matching using arrays of passives and/or the use of dummy components in the layout of the passives are not necessary. Laser trimming or fuse blowing are not necessary. The calibration technique described herein provides a higher level of accuracy than integrated calibration techniques that measure error at the backend and that apply a correction factor. Instead, the actual amplified error output is measured and the bias voltage providing DC compensation is adjusted accordingly. The calibration technique described herein operates continuously in the background during normal operation for transparency and provides the capability of correcting for inaccuracies or changes due to temperature, aging and/or operating conditions.

The calibration technique described herein does not require comparison with a reference value. The measurement is facilitated by a sigma-delta ADC that converts a measured voltage difference into a corresponding bit stream. Although sigma-delta techniques are relatively slow, speed is of little consequence since calibration converges sufficiently quickly. Furthermore, sigma-delta techniques are very accurate so that the calibration process maintains the bias voltages of the preamplifiers at a sufficiently high level of accuracy to significantly reduce preamplifier offsets. In the embodiment described herein, the bias voltages are digitally controlled and the digital bias values controlling the bias voltages are adjusted one LSB at a time to ensure stability and to avoid jittery operation. Also, lower and upper adjustment thresholds may be employed to avoid unnecessary over-adjustments while maintaining a requisite level of accuracy. The calibrator embodiment is not restricted to a sigma-delta converter, which can be replaced by other analog to digital conversion techniques.

Many modifications and other embodiments of the invention will come to mind of one skilled in the art having the benefit of the teachings presented in the foregoing descriptions and the associated drawings. Although a system and method according to the present invention has been described in connection with one or more embodiments of the invention, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A compensation system for transparently calibrating at least one amplifier of an array of amplifiers during operation of a circuit employing the amplifier array, each amplifier having a compensation input, the compensation system comprising:

first and second redundant amplifiers coupled on either side of the amplifier array, each having inputs coupled to inputs of a corresponding amplifier on a corresponding side of the amplifier array;

an interpolative resistive ladder between outputs of the redundant amplifiers and across the outputs of the amplifier array;

a measurement circuit that measures an output offset of a coupled amplifier;

a switching circuit, coupled to the amplifier array and the measurement circuit, that disconnects inputs and outputs of an amplifier of the amplifier array from the circuit and that connects the inputs of the disconnected amplifier to a common mode voltage and that connects the outputs of the disconnected amplifier to the measurement circuit to place the disconnected amplifier under calibration;

a compensation circuit, coupled to the measurement circuit and to the amplifier array, that applies a compensation bias to the compensation input of an amplifier under calibration and that adjusts the compensation bias in an attempt to reduce a measured output offset of the amplifier under calibration; and a control circuit, coupled to the switching circuit, the measurement circuit and the compensation circuit for controlling calibration.

2. The compensation system of claim 1, wherein the measurement circuit comprises:

a sigma delta converter, coupled to the control logic, that converts an output offset into a bit stream indicative of the output offset;

a counter, coupled to the control logic and coupled to receive the bit stream from the sigma delta converter, that stores a sum-value indicative of the output offset; and adjust logic, coupled to the counter and to the control logic, that determines an adjust value based on the sum value.

3. The compensation system of claim 2, wherein the compensation circuit comprises:

a memory, coupled to the adjust logic and to the control logic, that stores a digital bias value;

the adjust logic being configured to adjust the stored digital bias value for an amplifier under calibration; and a converter, coupled to the memory, that converts digital bias value to a bias voltage and that applies the bias voltage to the compensation input of the amplifier under calibration.

4. The compensation system of claim 3, wherein the adjust logic comprises digital compare logic that compares the sum value with upper and lower thresholds and that adjusts the stored digital bias value only if a threshold is reached.

5. The compensation system of claim 4, wherein the adjust logic adjusts the digital bias value only by one least significant bit at a time for each compensation cycle.

6. The compensation system of claim 3, wherein the converter comprises:

a pair of compensation capacitors that collectively store compensation charge which results in a differential compensation voltage being applied to a differential input of the amplifier under calibration;

a digital to analog converter (DAC), coupled to the memory, that converts the digital bias value into a differential bias current; and a current to voltage converter, coupled to the DAC and the pair of compensation capacitors, that converts the differential bias current into a differential pair of voltages and that charges the pair of compensation capacitors with the differential pair of voltages.

7. The compensation system of claim 6, further comprising:

charging switches, coupled to the current to voltage converter, the pair of compensation capacitors and the control logic; and wherein the control logic selectively controls the charging switches to recharge the pair of compensation capacitors using the differential bias voltages.

8. The compensation system of claim 6, wherein the adjust logic includes digital compare logic that compares the sum value with upper and lower thresholds and that adjusts the stored digital bias value only if a threshold is reached and wherein the adjust logic adjusts the digital bias value only by one least significant bit for each compensation cycle.

9. The compensation system of claim 3, wherein the memory stores a plurality digital bias values, each for a corresponding one of the amplifiers of the amplifier array.

10. The compensation system of claim 1, wherein the control circuit conducts calibration for each amplifier of the amplifier array one at a time, wherein for each amplifier, the control circuit controls the switching array to place an amplifier under calibration, controls the measurement circuit to measure an output offset of each amplifier under calibration and that controls the compensation circuit to apply compensation to each amplifier under calibration.

11. A method of transparently calibrating at least one amplifier of an array of amplifiers during operation of a circuit employing the amplifier array, each amplifier having a compensation input, said method comprising:

providing a pair of redundant amplifiers on either side of the amplifier array;

providing an interpolative resistive ladder across the outputs of the amplifier array and outputs of the redundant amplifiers;

removing inputs and outputs of an amplifier of the amplifier array from the circuit;

shorting the inputs of the removed amplifier to a common mode voltage;

measuring an output offset of the removed amplifier;

adjusting a corresponding compensation bias applied at the compensation input of the removed amplifier in an attempt to reduce the measured output offset; and re-connecting the inputs and outputs of the amplifier to the circuit.

12. The method of claim 11, wherein said providing a pair of redundant amplifiers on either side of the amplifier array comprises:

coupling inputs of a first amplifier on one side of the array to an input of a first redundant amplifier; and coupling an input of a second amplifier on an opposite side of the array to an input of a second redundant amplifier.

13. The method of claim 11, further comprising:

storing a digital bias value;

converting the digital bias value to the compensation bias;

said measuring an output offset of the removed amplifier comprising coupling an output of the amplifier to a sigma delta converter and applying an output bitstream of the sigma delta converter to a counter; and adjusting the digital bias value based on a value in the counter.

14. The method of claim 13, further comprising:

storing a plurality of digital bias values, each corresponding to one amplifier of the amplifier array; and selecting a digital bias value corresponding to the removed amplifier being calibrated.

15. The method of claim 13, further comprising:

comparing the value in the counter with predetermined upper and lower thresholds and adjusting the digital bias value only if either threshold is reached.

16. The method of claim 15, wherein said adjusting the digital bias value comprises incrementing or decrementing the digital bias value by one least significant bit.

17. The method of claim 13, further comprising:

providing a bias capacitor at the compensation input of each amplifier; and wherein said converting the digital bias value comprises converting the digital bias value to a bias voltage for storage on a bias capacitor of a removed amplifier.

18. The method of claim 13, further comprising:

providing a pair of bias capacitors at a corresponding differential pair of compensation inputs of each amplifier;

converting the digital bias value to a differential bias current; and charging the pair of bias capacitors using the differential bias current.

19. The method of claim 11, further comprising:

sequentially calibrating each of the amplifiers of the amplifier array by repeating said removing, shorting, measuring, adjusting, and re-connecting for each amplifier.

20. A compensation system for calibrating an amplifier having a compensation input, the compensation system comprising:

a sigma delta converter that converts an offset voltage to a bit stream indicative of the offset voltage;

a counter, coupled to receive the bit stream from the sigma delta converter, that stores a sum value indicative of the output offset;

a memory that stores a digital bias value;

adjust logic, coupled to the counter and the memory, that determines an adjust value based on the sum value and that is configured to adjust the stored digital bias value based on the adjust value;

a digital to analog converter (DAC), coupled to the memory, that converts the digital bias value to a differential bias current;

a pair of compensation capacitors that collectively apply a differential compensation voltage to a differential input of the amplifier; and a pair of current to voltage converters, coupled to the DAC and to the pair of compensation capacitors of the amplifier, that charges the pair of compensation capacitors using the differential bias current.

21. The compensation system of claim 20 wherein the adjust logic includes digital compare logic that compares the sum value with upper and lower thresholds and that adjusts the stored digital bias value only if a threshold is reached or exceeded and wherein the adjust logic adjusts the digital bias value only by one least significant bit for each compensation cycle.

* * * * *